United States Patent
Williams et al.

[11] Patent Number: 6,086,630
[45] Date of Patent: Jul. 11, 2000

[54] AUTOMATED PCB CHECKLIST

[75] Inventors: Stephen W. Williams, Ottawa, Canada; Richard Perkins, Research Triangle Park, N.C.; Derek McKay, Ottawa, Canada

[73] Assignee: Nortel Networks Corporation, Montreal, Canada

[21] Appl. No.: 08/772,263

[22] Filed: Dec. 23, 1996

[51] Int. Cl.[7] .................................................. G06F 15/00
[52] U.S. Cl. ............................................................. 716/15
[58] Field of Search ................................... 364/490, 491; 345/420; 716/15

[56] References Cited

U.S. PATENT DOCUMENTS

| | | | |
|---|---|---|---|
| 4,992,953 | 2/1991 | Yoshida et al. | 364/512 |
| 5,592,392 | 1/1997 | Matheson et al. | 364/490 |
| 5,633,807 | 5/1997 | Fishburn et al. | 364/491 |
| 5,740,341 | 4/1998 | Oota et al. | 395/120 |

OTHER PUBLICATIONS 5 page publication entitled "UniCAD Products" bearing an 1996 copyright.

*Primary Examiner*—Paul R. Lintz
*Assistant Examiner*—Thuan Do
*Attorney, Agent, or Firm*—Foley & Lardner

[57] ABSTRACT

An electronic checklist program is provided for commercially available printed circuit board layout design programs. The checklist program creates a file which is appended to a design file created by the layout program. The checklist program has step menus indicating steps for each interval to be completed in the layout design. When steps in an interval are completed, the time is logged for each and when an interval is done, the cumulative time is logged. The program tracks the last step completed such that on start-up with a previously created design, the program skips to the screen including the last completed step. Provision is also made to churn completed intervals and log churn time.

10 Claims, 8 Drawing Sheets

FIG. 6 MAIN PANEL

| | | |
|---|---|---|
| START_DATE_: | 19951115.0911 | LAST_UPDATE_: 1998121111543 |
| CURR_PROCESS: | HISTORY | |
| CURR_FILE_NAME: | nt7p18aa | STOP.1 |
| CASE_NUMBER: | 9512 | CDS_FILE: nt7p18aa.dd. |

| | ENG_CODE/DOC | STR | TSS | EPD_CODE | REL | MOD | TYP |
|---|---|---|---|---|---|---|---|
| PRINTED_CKT_BD: | NT7P1801 | 00 | 01 | P0327386 | 01 | | 1 |
| ASSEMBLY_PACK_: | NT7P18AA | 00 | 01 | A0327386 | | | |
| SCHEMATIC : | CS7P18AA | 00 | 02 | | | | |
| COMMON_FEATURES: | CF9P1310 | 00 | 01 | | | | |
| SPECIFIC_FEATRS: | SF7P1801 | 00 | 01 | | | | |

| | NAME: | DEPT: | TELEPHONE: | LOCATION: |
|---|---|---|---|---|
| PCB_DESIGNER: | S.WILLIAMS | OS64 | 393-6417 | > BNRCAR |
| PCB_CHECKER: | LORNA ACRES | OS64 | 393-4812 | > BNRCAR |
| CKT_DESIGNER: | CHRIS MCARTHUR | BVW | 343-3566 | > BVW |
| TECHNOLOGY : | RX040DSO2 | LAYERS: | 4 | |
| PCB_SIZE: | 12500 | 10000 | | |

| | | | |
|---|---|---|---|
| CHANGE_TYPE_: | PROTOTYPE | DESIGN CIRCLE: 1h1 | |
| ENG_CHG_TYPE: | 006-327386 | PRODUCT/TYPE: 32128 | LAYOUT/PORT: 32129 |
| TEXT_EDITOR_: | ved | SCHEMATIC_PORT: DPN100/3 | |

ENTER

PROCESS TABLE

| KICK_OFF |
| SCHEMATIC_VERIFICATION |
| COMMON_FEATURES |
| SPECIFIC_FEATURES |
| PLACEMENTS |
| PLACEMENT_VERIFICATION |
| MARKING_MATRIX |
| COMPONENT_PLACEMENT_AGREEMENT |
| ROUTING |
| ROUTING_VERIFICATION |
| ASSEMBLY_VERIFICATION |
| DESIGN_VERIFICATION |
| PHYSICAL_AGREEMENT |
| FABRICATION |
| HISTORY |

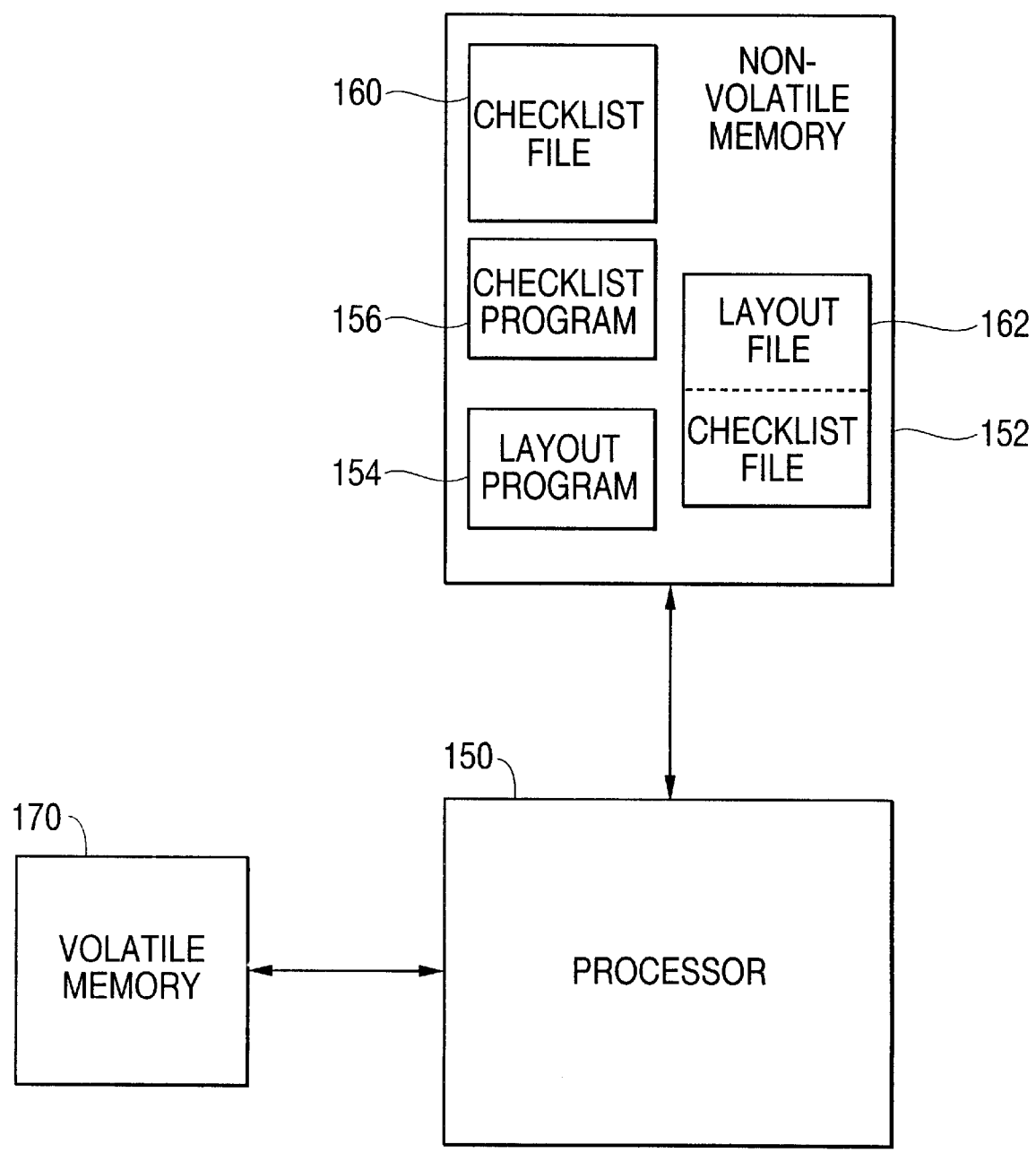

AUTOMATED PCB CHECKLIST

FIELD OF THE INVENTION

This invention relates to a method for verifying a given printed circuit board (PCB) layout design and to an electronic system for use in conjunction with an electronic PCB layout design system for generating a PCB layout file.

DESCRIPTION OF THE RELATED ART

There are a number of commercially available software packages for facilitating the design of a layout for a printed circuit board (PCB). It is recognized by PCB designers that a number of steps must be taken in order to achieve a workable and efficient design. These steps are partly based on standards which are up-graded from time to time and are also dependent upon the components which are to be utilized in the populated PCB. The designer therefore refers to a number of different checklists in executing a layout design. An experienced designer may also proceed partly on the basis of memory. In any event, there is a considerable amount of paper that may to be referred to in designing a layout. Further, in some instances one designer may begin a design but may not be able to complete it due to work load or other difficulties. In such circumstances, another designer would like to pick up where the first designer left off, but this may prove difficult since there is no accepted order to undertaking many of the steps needed to create the PCB design. The industry standard design practices therefore have some inherent inefficiencies which the present invention seeks to overcome.

SUMMARY OF THE INVENTION

According to the present invention, there is provided a method for verifying a given PCB layout design, comprising: on request, displaying a menu of intervals for designing a PCB layout; on request, displaying a menu of steps associated with each of said intervals in said menu of intervals, each of said steps for designing a PCB layout; allowing a user to indicate steps in a given PCB layout design as completed steps and thereafter visually differentiating said completed steps and, where all steps in a given menu of steps are completed steps, visually differentiating an interval associated with said given menu of steps to indicate a completed interval; storing indications of completed steps and completed intervals in a checklist file; appending said checklist file to a layout design file containing said given PCB layout design.

According to another aspect of the invention, there is provided an electronic system for use in conjunction with an electronic PCB layout design system for generating a PCB layout file, comprising: an interval menu for displaying intervals for designing a PCB layout; a step menu associated with each interval in said interval menu for displaying steps for designing a PCB layout; means for allowing a user to indicate steps in a given PCB layout design as completed steps and for visually differentiating said completed steps and, where all steps in a given interval are completed steps, for visually differentiating said given interval to indicate a completed interval; means for storing indications of completed steps and completed intervals in an output file; means for appending said output file to a layout file generated by said PCB layout design system for said given PCB layout design.

BRIEF DESCRIPTION OF THE DRAWINGS

In the figures which illustrate an example embodiment of the invention,

FIG. 6 and FIG. 7 illustrate sample screens from the embodiment of the invention illustrated in FIGS. 1 through 5, and FIG. 8 is a sample system made in accordance with an embodiment of this invention.

DETAILED DESCRIPTION OF THE PREFERRED EMBODIMENTS

In overview, the present invention provides a menu driven electronic checklist for use in conjunction with an electronic PCB layout design program. By way of the electronic checklist, a user may tick steps in the design process as done and log the time taken for such steps. When an interval (which involves a sequence of steps) is completed, the accumulated time for that interval is logged. In the case of an engineering change, the user may select a "churn" in respect of a completed interval affected by the engineering change in which case the interval and the steps for the interval are changed to indicate they are not done, and the steps are put on screen for redoing. The last completed step is tracked. At the conclusion of a session, a checklist file containing the checklist information (e.g., steps done, times logged, and an indication of the last completed step) is written to non-volatile memory and is also appended to a layout design file created by the layout design program. If a partially completed design is reloaded along with its associated checklist file in a new session, the stored indication of the last completed step allows the electronic checklist to jump to the menu screen containing the last step done.

It is particularly advantageous to use the electronic checklist in conjunction with a layout design program in a multi-tasking environment, such as UNIX since this allows a user to flip back and forth between the electronic checklist and the layout design program. One suitable off-the-shelf layout design program for use with the electronic checklist is UNICAD LAYOUT™ produced by Unicad, Inc.

Figure 1:
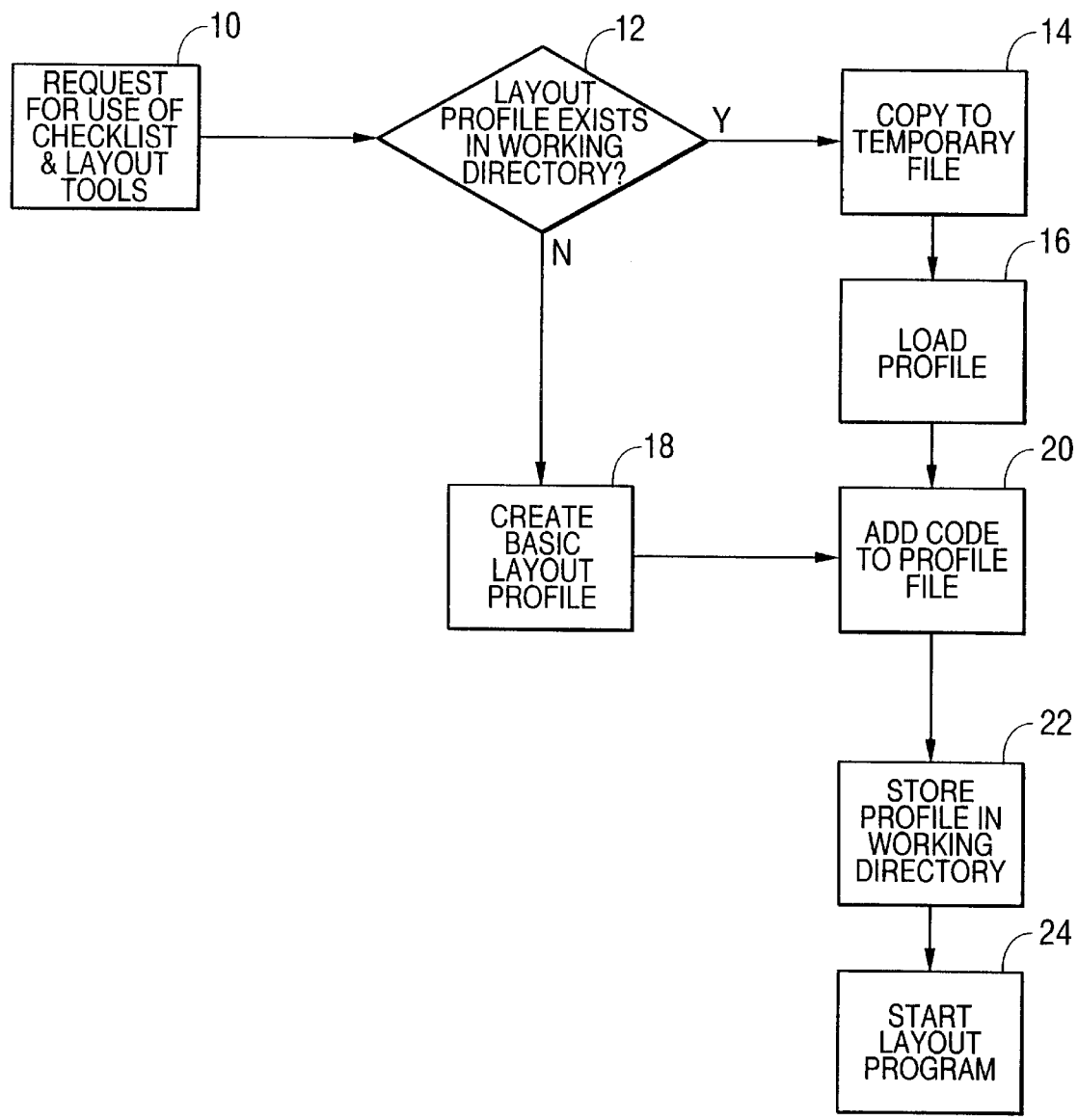
FIGS. 1, 2, 3, 4, and 5 are flow diagrams illustrating an embodiment of the subject invention.

Turning now to FIG. 1, a user who wishes to use the electronic checklist and a layout design program may enter the name of a batch file (box 10). Program control then passes to the batch file which looks for a profile file in respect of the layout design program in the working directory of non-volatile memory (box 12). The profile, which is a standard component of layout programs (and, indeed, of many other types of programs) is used by the layout program on start-up to configure itself. If the profile is found, it is copied to a temporary file (box 14) and it is loaded into resident (i.e., volatile) memory (box 16). If a profile is not found, then a basic profile is created (box 18). In either case, certain code is next added to the profile (box 20). As will become apparent hereinafter, the code added is code which will result in the layout design program being loaded along with the electronic checklist program of this invention and which will provide other features of this invention. The modified profile is then stored in the working directory (box 22) and the batch file then invokes the layout program (box 24).

Figure 2:
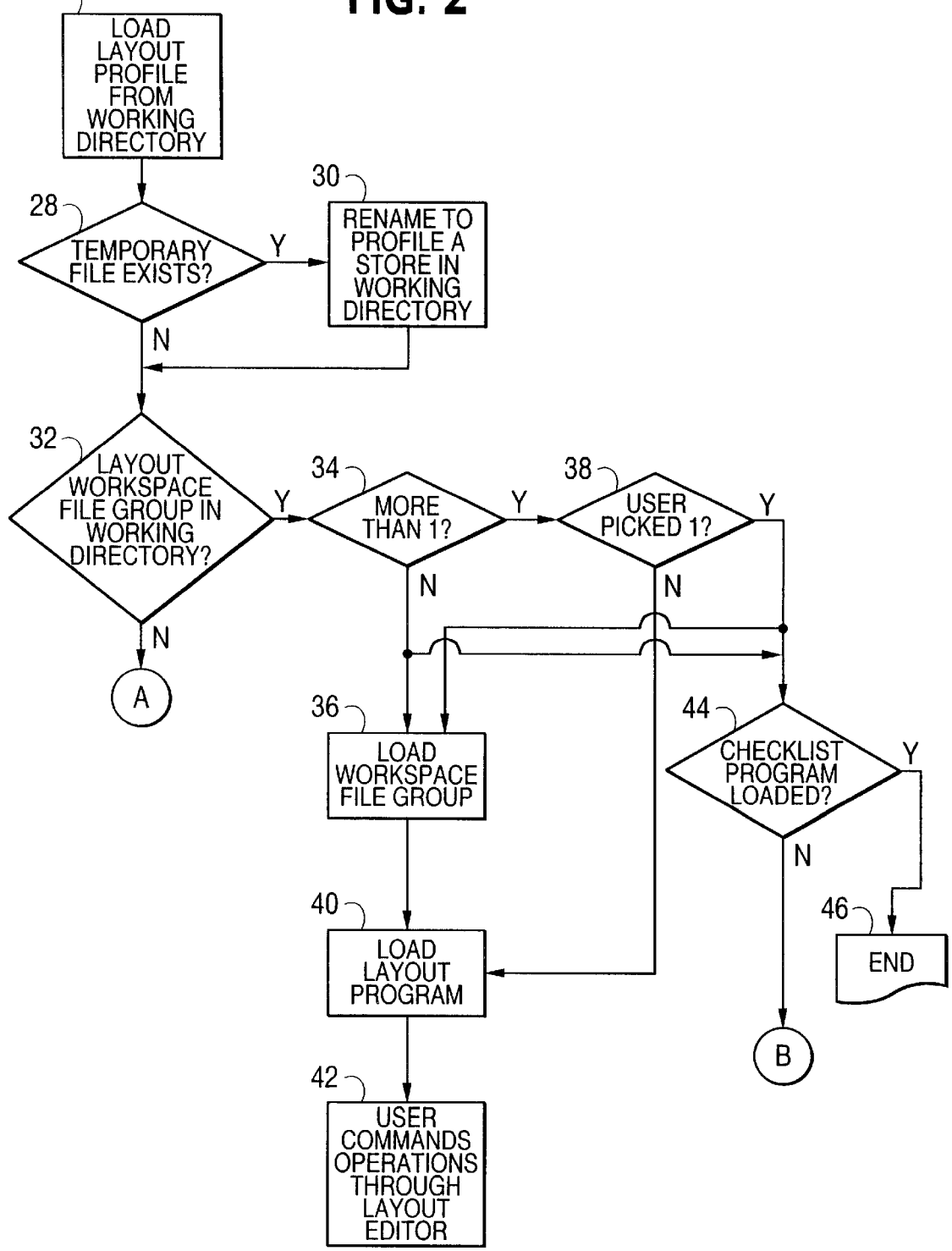

Turning now to FIG. 2, when the layout program is invoked, it loads the layout profile into resident memory which, it will be recalled, has been modified by the batch file (box 26). Under control of the modified profile file, the layout program then looks for a temporary file in the working directory (box 28) and if this is found, the temporary file in non-volatile memory is renamed to the profile file. Of course, this does not affect the loaded modified profile file which is actively executing in resident memory. The coding in the modified profile file then results in the search for a layout workspace file group in the working directory (box 32). As will be understood by those skilled in the art, a layout design program may be input with a design file; once the program has worked on a design file, it creates a number of attendant additional files which, together with the design file, are considered a workspace file group. If a workspace file group is found, and there is only one (box 34), then it is loaded into resident memory (box 36). If there is more than one and the user picks one (box 38), then the chosen one is loaded. If the user indicates that none of the workspace file groups in the working directory of non-volatile memory are to be chosen, then the layout program will load without any workspace file group. Otherwise, the layout program will load in conjunction with the chosen workspace file group (box 40). The layout program may then operate on the workspace file group through a user's commands through a layout editor (box 42), as will be understood by those skilled in the art.

If there is a workspace file group, then, whether or not there is more than one, the modified profile code will determine whether the checklist program is loaded (box 44). Normally, it would not be, but if it is, then no further action will be taken in this connection (box 46). If, as would be the usual case, the checklist program were not loaded, program control passes to decision block 50 of FIG. 4.

Figure 3:
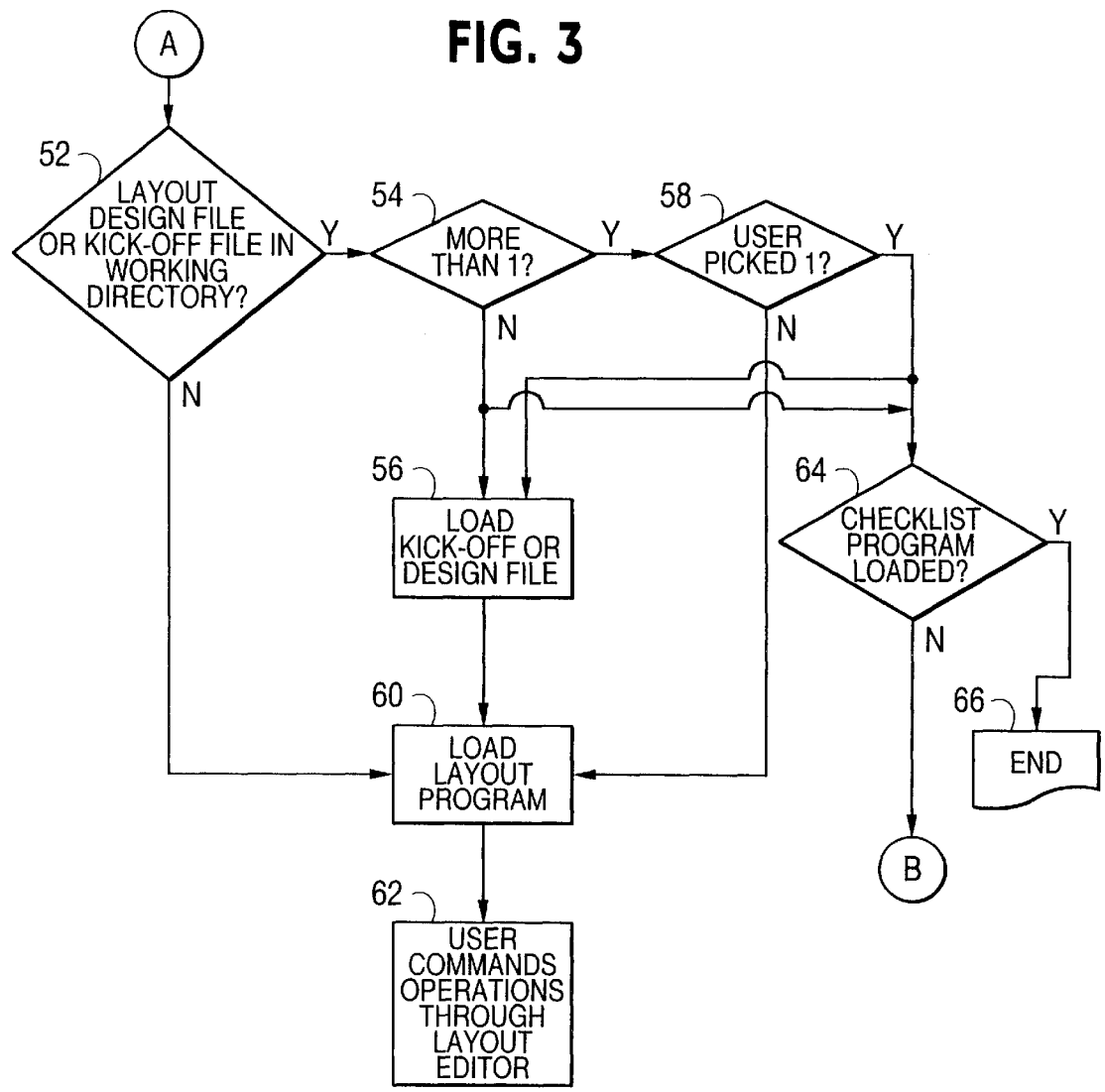
Figure 4:
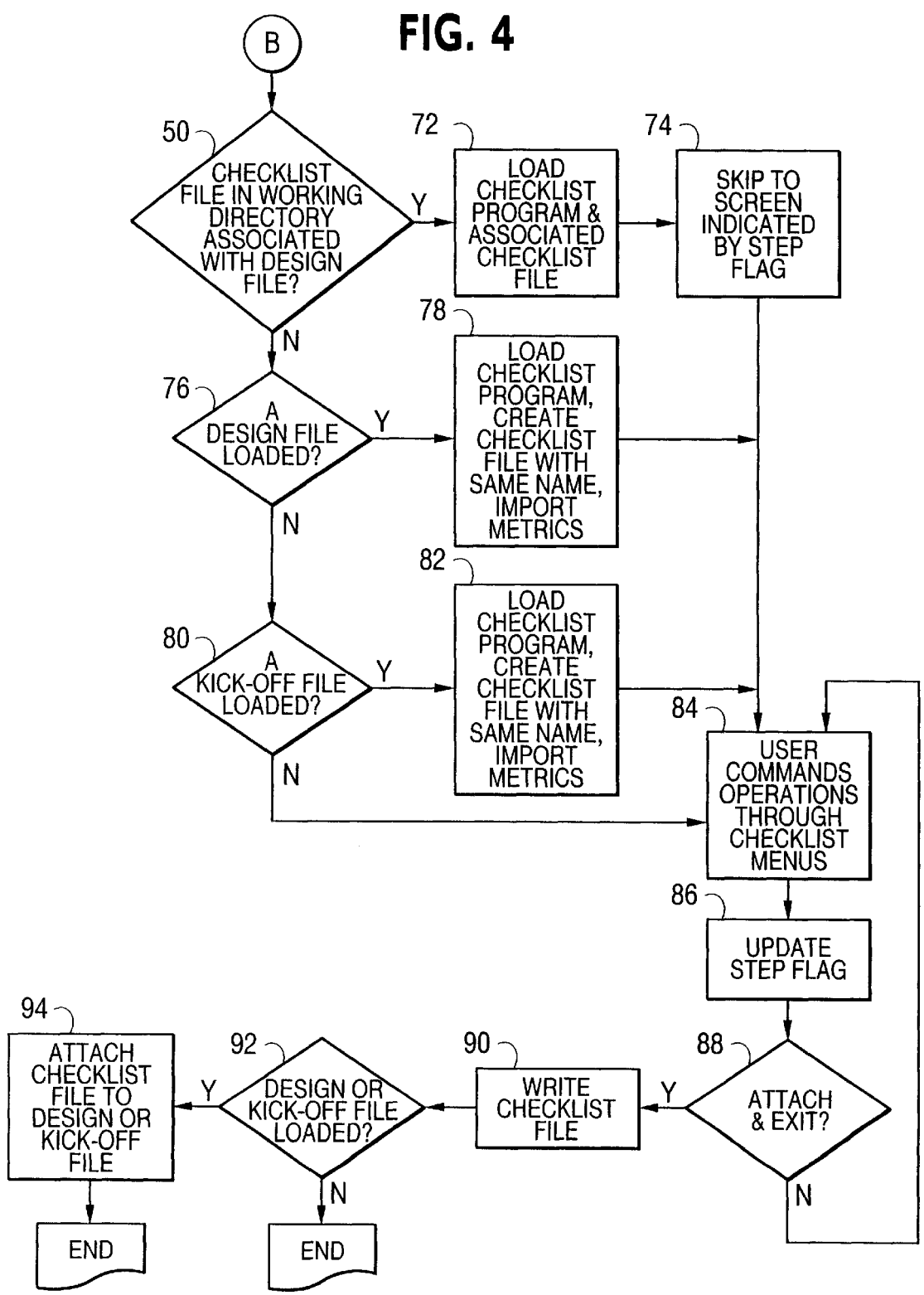

Prior to turning to FIG. 4, the situation in which there is no layout workspace file group in the working directory is considered (a "no" decision in decision block 32). In this case, turning to FIG. 3, it is asked whether there is a layout design file, or at least a kick-off file (which is a skeletal precursor to a design file which includes metrics but no design information) in the working directory. If yes and there is only one (box 54) it is loaded (block 56). If there is more than one and the user picks one (block 58), the chosen one is loaded. After loading a kick-off or design file, or where the user declines to make a choice, the layout program is next loaded (block 60) and, again, the user may then issue commands to the layout editor (block 62).

Where there is one or more design or kick-off files, it is asked whether the checklist program is loaded (Block 64). In the unusual case where it is, no further action is taken (block 66). Where it is not, which is the usual situation, again program control passes to decision block 50 of FIG. 4.

Recall that a design file is either loaded as part of a workspace file group or is loaded on its own, where it is a new design file which has not yet been worked on by the layout design program such that no workspace file group has yet been created for it. Turning to FIG. 4, at decision block 50 there is a search in the working directory for a checklist file associated with the loaded design file. This search initially is based on file names. A design file will have a name followed by a certain design file extension. Similarly, a checklist file will have a name followed by a checklist file extension. Where a same name checklist file is found, the checklist program is loaded in conjunction with the same name checklist file (box 72). If a checklist file with the same name is not found in the working directory, the search continues by examining the design file which was loaded to see whether a checklist file was appended to it. If yes, this checklist file is loaded in conjunction with the checklist program. The loaded checklist file will have an indicator of the last completed step ticked as done by user and this will cause the checklist program to skip to the screen with the step menu containing that last completed step (block 74).

If no associated checklist file is found in the working directory but there is a design file loaded (block 76), then the checklist program is loaded and a checklist file with the same name as the design file is created and all metrics in the design file are imported to the newly created checklist file. In case no design file is loaded but a kick-off file has been loaded (block 80), again the checklist program will be loaded in the checklist file created with the same name as the kick-off file and the metrics of the kick-off file imported to the checklist file (block 82).

After any of the three different situations of blocks 72/74, 78 and 82, control passes to the user to command operations in the checklist program (block 84). Each time the user ticks a step as done, a step flag is up-dated (block 86) in the checklist file. When a user exits from the checklist program (block 88), the checklist file is written to non-volatile memory (block 90) and, where a design or kick-off file is loaded (block 92), the checklist file is also attached thereto (block 94).

Figure 5:
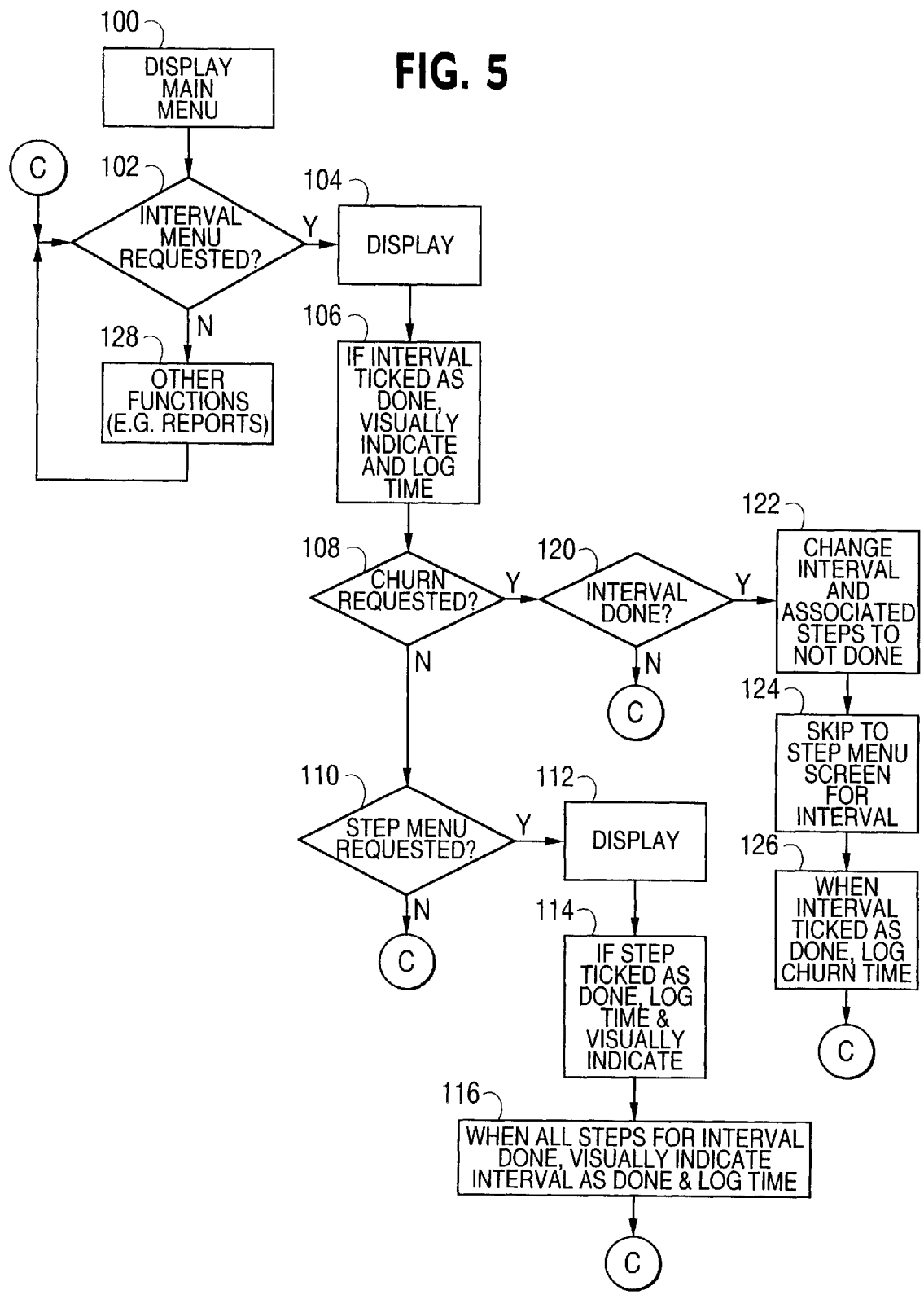
Figure 7:
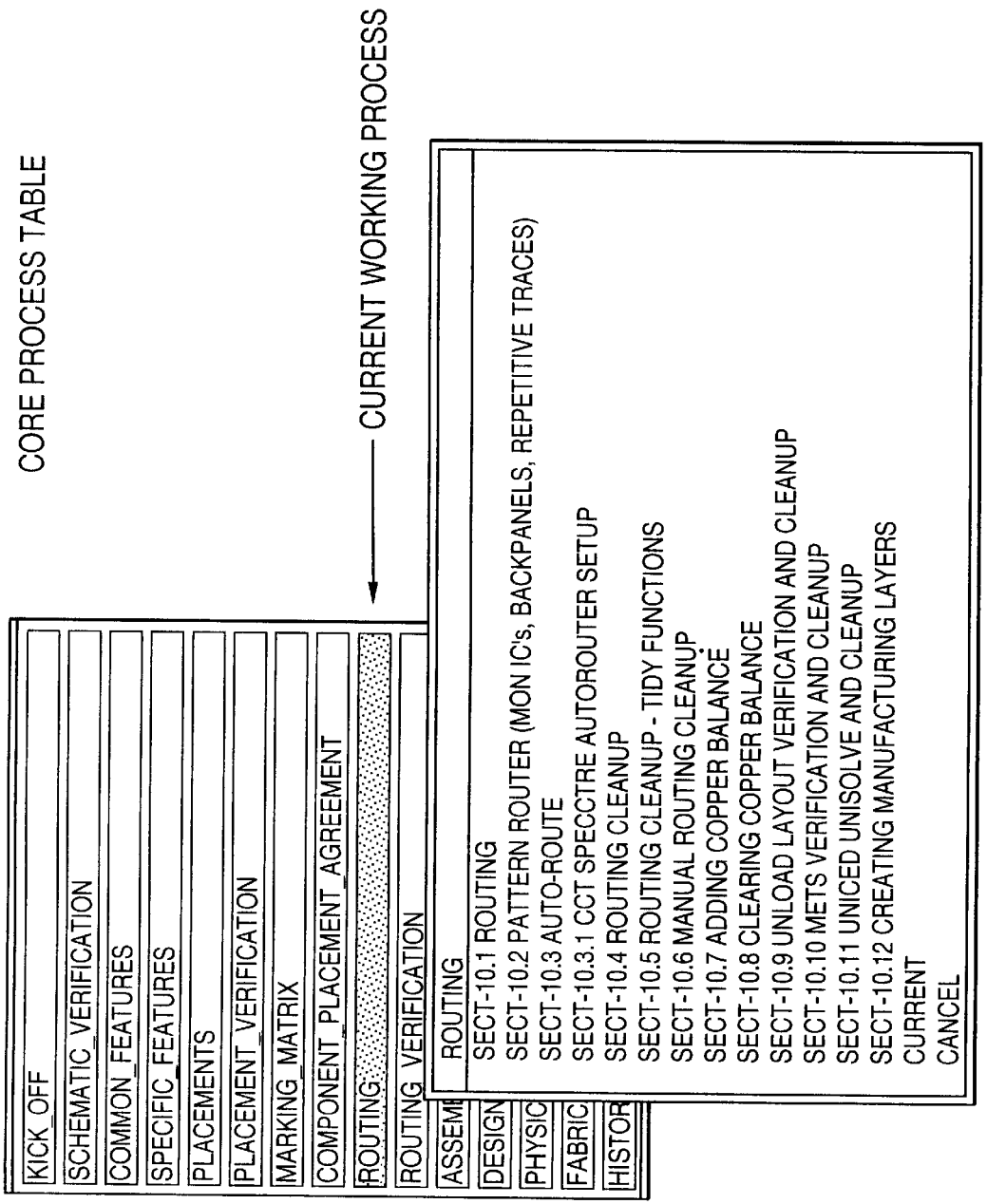

FIG. 5 details the operation of the checklist program which was summarily indicated at block 84 of FIG. 4. Turning to FIG. 5, when the checklist program is first loaded, a main menu is displayed (block 100). This main menu will show metrics for the layout design job and will allow the user to select an interval menu (block 102) which, if chosen, will be displayed (block 104). FIG. 6 illustrates a sample main menu displayed with an interval menu. A user may tick an interval as done through an input device (such as a key pad or mouse). If so, then the colour blocking the interval changes to provide a visual indication that the interval is completed. As well, the program then asks for a time to log for the interval. Alternatively, a user may request a churn or a step menu (block 108 and 110, respectively). If a step menu is requested, the menu is displayed (block 112). FIG. 7 illustrates a sample step menu for the routing interval. The user may indicate a step as done in which case the colour of the step will change to visually indicate the completion of the step. As well, the program will request time for this step be logged (box 114). When all steps for an interval are completed, the interval is visually indicated as done and the cumulative time logged for all steps is logged as the interval time (box 116).

In a case where a churn is requested, the program will decide whether or not the interval is completed (block 120). If not, the churn request is denied, but if yes the interval and associated steps are changed from done to not done (box 122) and the program skips to the step menu screen for the interval so that the user may again work through the steps (block 124). When all steps are again completed such that the interval is ticked as done, the logged time is logged as churn time (block 126).

In place of requesting the interval menu, certain other functions may be requested through the checklist program such as, for example, report functions to print out reports of completed steps and elapsed time (block 128).

FIG. 8 illustrates a sample system for implementation of this invention. Turning to FIG. 8, a processor 150 is coupled for two-way communication with non-volatile memory 152. The non-volatile memory will store a commercially available layout program having a layout profile and a checklist program (154 and 156, respectively). The memory will also store one or more checklist files (block 160) and one or more layout files (block 162). Each layout file may have a checklist file appended to it. Processor 150 is also coupled for two-way communication with volatile memory 170 such that files from the non-volatile memory may be up-loaded to volatile memory.

It should be noted that a commercially available layout program may be expected to handle a layout design file with an appended checklist file as an ordinary design file since the appended checklist file will be considered as non-design data of a comment-type nature appended to the design file. If the layout program cannot accommodate a layout file having a checklist file directly appended to it, then the appending may be done notionally through the use of the same name for the checklist file as for the layout file. It will also be noted that even where a checklist file is appended to a layout file, the checklist file is also independently written into non-volatile memory. This facilitates speedy recovery of a checklist file associated with a particular layout file.

Appending a checklist file to a design file facilitates load sharing. That is, when one layout designer begins work on a design project but does not complete same, the designer may ship the project to another designer simply in the form of the layout design file with appended checklist file. The fact that the checklist program, on start-up with a checklist file, skips to the screen with the last completed step also facilitates load sharing since it brings the new designer right to the point where the previous designer left off.

Modifications will be apparent to those skilled in the art and, therefore, the invention is defined in the claims.

What is claimed is:

1. A method for verifying a given PCB layout design, comprising:

on request, displaying a menu of intervals for designing a PCB layout;

on request, displaying a menu of steps associated with one of said intervals in said menu of intervals, each of said steps for designing a PCB layout;

receiving from a user an indication that a step in a given PCB layout design is a completed step and in response, visually differentiating visual representations of said completed step from visual representations of non-completed steps;

where all steps in a given interval are completed steps, visually differentiating visual representations of said given interval to indicate a completed interval;

storing indications of completed steps and completed intervals in a checklist file;

appending said checklist file to a layout design file containing said given PCB layout design.

2. The method of claim 1 including tracking a step last indicated as a completed step by said user and storing said last completed step in said checklist file.

3. The method of claim 2 including, initially, retrieving a layout design file and retrieving an associated checklist file, if any, and, responsive to said stored last completed step in said retrieved checklist file for, initially, displaying a step menu containing said last completed step.

4. The method of claim 3 wherein said step of storing is also for naming said checklist file with a name having a portion identical with a portion of a name for said layout file containing said given PCB layout design.

5. The method of claim 4 wherein the step of retrieving an associated checklist file comprises searching for a checklist file having a name with a portion identical with a portion of a name for said layout file containing said given PCB layout design and, on finding a matching checklist file, retrieving said matching checklist file.

6. The system of claim 5 including, where no associated checklist file exists, creating a checklist file associated with said given PCB layout design file and importing metrics from said given PCB layout design file to said associated checklist file.

7. The method of claim 1 including allowing a user to request a churn for an interval, for denying said user request if said interval is not a completed interval and, where said interval is a completed interval, for accepting said churn request and changing said interval to a non-completed interval and said steps of a step menu associated therewith to non-completed steps and for displaying said associated step menu.

8. The method of claim 7 including allowing a user to log times for the taking of a completed step and including indicating cumulative time taken for a completed interval and wherein said step of storing also comprises storing cumulative time for a completed interval.

9. The system of claim 8 wherein said step of storing also comprises storing, as churn time, time logged for the taking of completed steps associated with an interval in respect of which a churn request was accepted.

10. An electronic system for use in conjunction with an electronic PCB layout design system for generating a PCB layout file, comprising:

an interval menu for displaying intervals for designing a PCB layout;

a step menu associated with each interval in said interval menu for displaying steps for designing a PCB layout;

means for receiving an indication that a step in a given PCB layout design is a completed step and for, responsive thereto, visually differentiating visual representations of said completed step from visual representations of non-completed steps and where all steps in a given interval are completed steps, visually differentiating visual representations of said given interval to indicate a completed interval;

means for storing indications of completed steps and completed intervals in an output file;

means for appending said output file to a layout file generated by said PCB layout design system for said given PCB layout design.

* * * * *